United States Patent [19]

Kimura et al.

[11] 4,025,940
[45] May 24, 1977

[54] MOS TYPE SEMICONDUCTOR DEVICE

[75] Inventors: Takeji Kimura; Michihiro Inoue, both of Hirakata; Masaharu Sato, Moriguchi; Shiro Horiuchi, Neyagawa, all of Japan

[73] Assignee: Matsushita Electric Industrial Co., Ltd., Osaka, Japan

[22] Filed: Oct. 14, 1975

[21] Appl. No.: 621,839

[30] Foreign Application Priority Data

Oct. 18, 1974 Japan .......................... 49-120856
Aug. 19, 1975 Japan .......................... 50-100846
Sept. 2, 1975 Japan .......................... 50-106750

[52] U.S. Cl. ................................................. 357/23
[51] Int. Cl.² ....................................... H01L 29/78
[58] Field of Search ..................................... 357/23

[56] References Cited

UNITED STATES PATENTS

3,328,601  6/1967  Rosenbaum .......................... 357/23
3,745,426  7/1973  Olmstead ............................. 357/23
3,812,517  5/1974  Sato et al. ............................ 357/23

Primary Examiner—Edward J. Wojciechowicz
Attorney, Agent, or Firm—Stevens, Davis, Miller & Mosher

[57] ABSTRACT

The channel current of an MOS transistor is controlled by varying the potential distribution in the source area. The source area is formed of a resistive material and provided with at least two electrodes on at least one of which a controlling voltage is applied. The current between the source and the drain terminals increases more rapidly than the linear change with respect to the increase in the voltage between the terminals, i.e. current-voltage characteristics are convex toward the lower direction. This device has excellent characteristics for use as a discharge impedance element in a sustain function circuit of an indirect keying or other circuit of an electronic musical instrument.

14 Claims, 14 Drawing Figures

MOS TYPE SEMICONDUCTOR DEVICE

This invention relates to an MOS (Metal-oxide layer-Semiconductor) structure device, and more particularly to an MOS type variable impedance device in which desired characteristics are obtained by applying a controlling voltage to an additional electrode of an MOS structure device.

Variable impedance devices are used, for example, in sustain function circuits for indirect keying in electronic musical instruments. Namely, an MOS-FET (field effect transistor) is used for switching the sound signal by means of the gate voltage which is controlled to perform desired indirect keying. When a key in the keyboard is depressed, a voltage is applied to the gate of the FET to drive the FET to a fully ON state and hence to transmit sound signals through the FET. At the same time, charge is stored in a capacitor connected between the gate of the FET and ground. Here, the variable impedance device is also connected as a discharging impedance element in parallel with the capacitor. Thus, when the key is released, the charge stored in the capacitor gradually discharges through this discharging impedance element to lower the gate potential of the FET. Hence, the FET is gradually driven from the fully ON state to the OFF state. Thus, the sustaining effect for the musical sound is provided. The discharging impedance element should preferably be a variable impedance element.

A bipolar transistor, the current voltage characteristics between the collector and the emitter of which are controlled by the base current, and an FET, the current voltage characteristics between the source and the drain of which are controlled by the gate potential, are well-known examples of the conventional variable impedance element. Besides the above, there are, 1. an FET having two gate electrodes formed at both ends of a semiconductor gate region, in which a variable biasing voltage is applied between these two gate electrodes so as to change the current between the source and the drain and thereby control the FET characteristics, and 2. an MOS-FET having two additional ohmic contacts at both ends of the channel region, in which an electric field is applied between these contacts to inject interface charges into the double insulation layer to give spatial variations in the threshold voltage thereby changing the current between the source and the drain and controlling the FET characteristics. The current voltage characteristics between the source and the drain of these devices and of bipolar transistors are all pentode characteristics similar to those of the usual FET's. Namely, with an increase of the source-to-drain voltage the current increase becomes smaller than that of the linear change resulting in an upwardly convex characteristics. When a charge stored in a capacitor is discharged through an element, the current flowing through which is linearly proportional to the voltage across it, i.e. a resistor, the voltage across the capacitor decreases exponentially. When this exponentially decreasing voltage is supplied to an MOS-FET for indirect keying, since the MOS-FET for indirect keying has pentode-like characteristics, i.e. saturation characteristics, the time change of the level of the envelope of a sound signal becomes looser than the exponential change. Namely, the ratio of change at the beginning of the damping becomes smaller than that of the exponential change.

The preferable damping characteristic, i.e. the time change of the level, of a sound signal in an electronic musical instrument in the sustain operation is one which decreases exponentially or which decreases more rapidly than the exponential decrease at the beginning of damping and more gradually than the exponential decrease in the ending period.

Therefore, the preferred characteristics for a discharging element in a sustain circuit of an electronic musical instrument are those in which the current voltage characteristics are downwardly convex, i.e. the terminal current becomes larger than that of the linearly proportional change with an increase in the terminal voltage. Further, for varying the sustain time in an electronic musical instrument, the terminal current should be able to be varied through a control terminal.

This invention is to provide an MOS structure variable impedance device adapted for use in the sustain circuit of an electronic musical instrument, having current voltage characteristics convex toward downward direction and a variable time constant in the sustain operation.

An object of this invention is to provide an MOS structure device having a channel current controlled through a terminal other than the gate electrode.

Another object of this invention is to provide an MOS structure device, the channel current of which is controlled by varying the potential distribution in a source region.

A further object of this invention is to provide an MOS structure device adapted for use in an electronic musical instrument having such characteristics that the current voltage characteristics are downwardly convex, i.e. the current between the terminals becomes larger than the linearly proportional value with an increase of the voltage between the terminals, and that the current is controlled by the voltage applied to a controlling terminal or terminals.

Another object of this invention is to provide an MOS structure device having improved controllability by the voltage applied to a controlling terminal or terminals.

Another object of this invention is to provide an effective structure for a basic circuit component in which the controllability by the voltage applied to a controlling terminal or terminals is improved as desired.

Another object of this invention is to provide a variable impedance device having reduced loss current accompanied by the application of a controlling voltage to a controlling terminal or terminals.

According to one aspect of this invention, there is provided an MOS type semiconductor device comprising a field effect transistor including a source region at least partially formed of a resistive material, and at least two electrodes formed on the source region, at least one of the electrodes being provided for applying a controlling voltage to the source region to establish potential distribution in the source region and control the channel current in the channel region between the source and the drain region, and thereby provide a variable impedance.

Other objects, features, and advantages of this invention will become apparent in the following description made in conjunction with the accompanying drawings, in which:

This invention is intended to provide a variable impedance device having such current voltage characteristics that the current between the terminals changes in a downwardly convex manner with respect to the increase in the voltage between the terminals, i.e. the current increases more rapidly than the linearly proportional value to the voltage, and the current is controlled by the voltage applied to a controlling terminal or terminals.

Various embodiments of this invention will be described in connection with the accompanying drawings hereinbelow.

Figure 1:
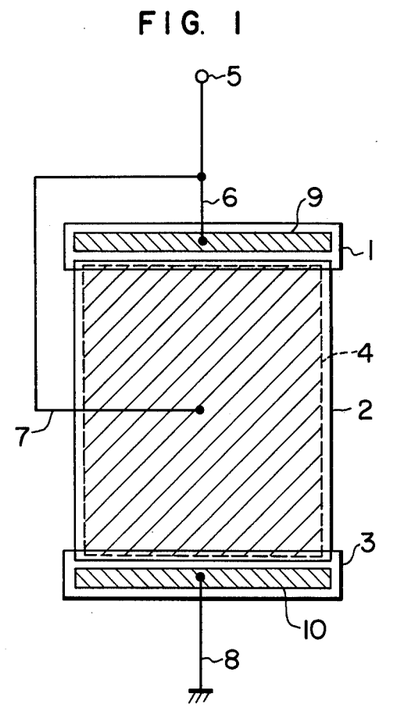
FIG. 1 is a schematic plan view of an example of the conventional MOS type transistor.
Figure 2:
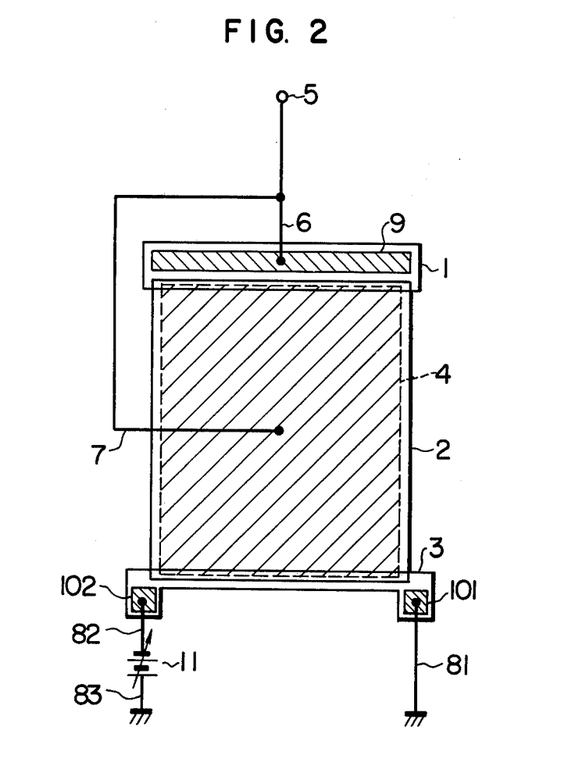
FIG. 2 is a schematic plan view of a variable impedance device according to an embodiment of this invention.

FIG. 1 shows a conventionally known MOS type transistor having the gate electrode connected to the drain electrode, in which numeral 1 denotes a drain region, 2 a gate electrode, 3 a source region, 4 a gate-cut area in which a gate oxide film is so thin as to produce a channel region thereunder, the hatched area being the channel region, 5 an external terminal, 9 an electrode to the drain region 1, 10 an electrode to the source region 3, 6 an interconnection lead between the drain electrode 9 and the external terminal 5, 7 another interconnection lead between the gate electrode 2 and the external terminal 5, and 8 an interconnection lead between the source electrode 10 and the substrate. As is well known, the current I in a p-channel transistor formed of an n-type semiconductor can be expressed as a function of the voltage V across the channel, $$I = -(\beta/2)(V - V_T)^2 \quad (1),$$

where $V_T$ represents a threshold voltage and $\beta$ a constant determined by the material, structure, etc. and being not controllable by the application of an external voltage, etc. after the manufacture of the device. This invention makes it possible in an equivalent circuit to electrically control said parameters $\beta$ and $V_T$ externally. An embodiment is shown in FIG. 2. FIG. 2 shows a p-channel device formed of an n-type substrate similar to the device of FIG. 1. Reference numerals similar to those in FIG. 1 denote similar parts. The source region 3 is provided with two electrodes 101 and 102 at both ends. The electrode 101 is connected to the substrate through a connection lead 81 and the other electrode 102 through connection leads 82 and 83 and a variable voltage source 11. The source region 3 is formed of a p-type semiconductor having a sheet resistivity of 5 K$\Omega$/□ in this embodiment. Assuming that the voltage source 11 supplies a voltage $V_C$, the source region 3 is formed of a resistive material having a uniform width, and no voltage is applied to the terminal 5, the potential $V_S$ in the source region 3 changes linearly from $V_C$ to zero in the lateral direction.

It is generally known that the characteristics of an MOS transistor having a source potential above that of the substrate can be approximated by equation (1) with $V_T$ replaced by $V_T + \alpha V_T$. Here, $\alpha V_T$ is due to the "body effect". Further, since the source-drain voltage becomes lower by the source potential $V_S$, the current voltage characteristics of the device of FIG. 2 becomes:

$$I = -\beta/2(V - V_S - V_T - \alpha V_T)^2 \quad (2).$$

In the MOS device of this embodiment, the voltages $V$, $V_C$, $V_T$, $\Delta V_T$, and $V_S$ are all negative,
$V = 0$ to $-15$ volts
$V_C = 0$ to $-15$ volts
$V_T \approx -1$ volt, $\Delta V_T$ has a negative value determined by the source potential $V_S$ and the absolute value of $\Delta V_T$ and $|\Delta V_T|$ increase with an increase of $|V_S|$.

Now, in the structure of FIG. 2, the source potential changes from zero to $V_C$ as the position shifts potential changes from zero to $V_C$ as the position shifts from the right to the left. Thus, the body effect $|\Delta V_T|$ is also at a maximum at the leftmost end of the source and is approximately zero at the rightmost end. Namely, as is also apparent from equation (2), the body effect $|\Delta V_T|$ is larger and hence the decrease of current is larger as the position approaches the left end. Namely, in the structure of FIG. 2, the current flow from the drain to the source is not uniform, but decreases as the lateral position approaches the left end. When the value $|V_C|$ is made larger, the rate of the current decrease becomes larger. Namely, the total current between the drain and the source is controlled by the value of $|V_C|$.

Figure 3:
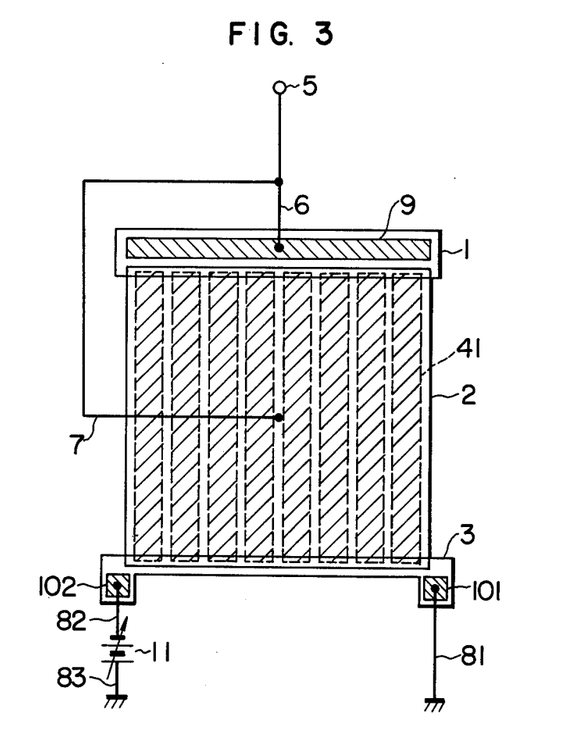
FIG. 3 is a schematic plan view of a variable impedance device according to another embodiment of this invention.

FIG. 3 shows another embodiment of this invention, in which similar numerals as those of FIGS. 1 and 2 denote similar parts. In FIG. 3, numeral 41 denotes a so-called gate-cut area which is formed in a stripe shape in contrast to the one rectangular shape of FIG. 2. In the structure of FIG. 2, when the voltage $|V_C|$ at the terminal 102 is made larger, the channel current becomes concentrated in the righthand side. In the structure of FIG. 3, since the gate is formed in a stripe shape, the current flows along these strips and the current concentration in the vicinity of a source electrode as is the case with the structure of FIG. 2 does not occur. Thus, the controllability for the channel current by the voltage $V_C$ is improved in the structure of FIG. 3 compared to the structure of FIG. 2.

Figure 4:
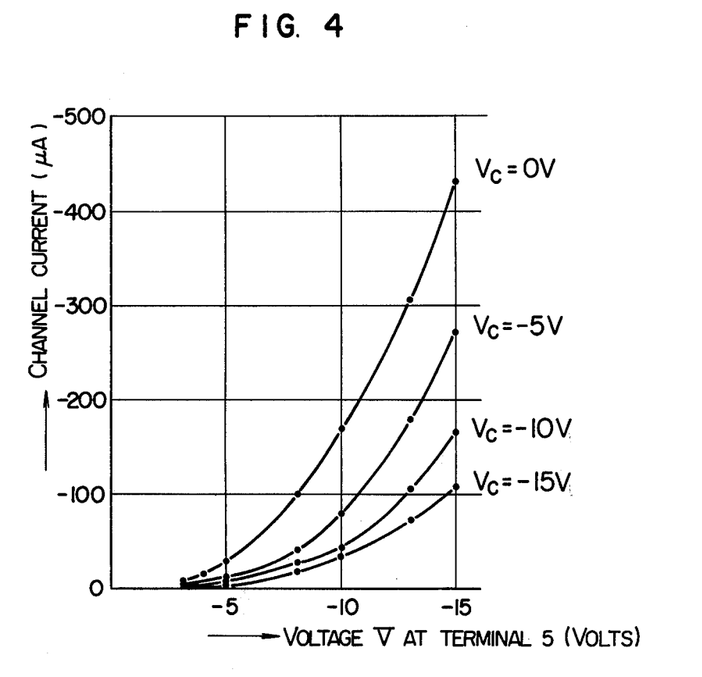
FIG. 4 shows characteristic curves of the device of FIG. 3.

The relation of the voltage between the terminal 5 and the substrate and the channel current in the structure of FIG. 3 having equal gate width W and gate length L with the variation of a parameter $V_C$ is shown in FIG. 4.

As is shown in FIG. 4, the channel current I can be expressed approximately as $$I \cong K(V - V_T)^2,$$

where K is controlled by the controlling voltage $V_C$ and was varied by a factor of about four by changing $V_C$ from zero to $-15$ volts.

Figure 5:
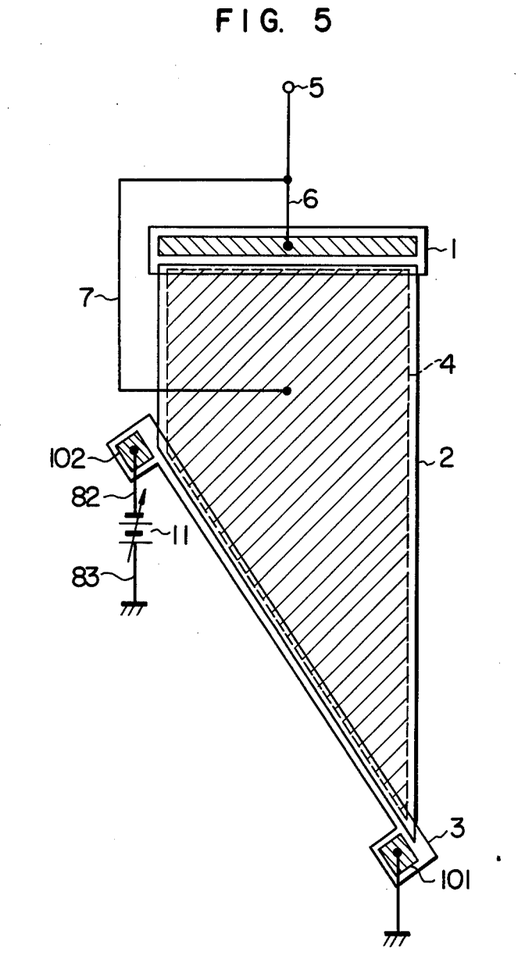
FIG. 5 is a schematic plan view of a variable impedance device according to another embodiment of this invention.

FIG. 5 shows another embodiment which has improved the controllability for the channel current by the voltage $V_C$. In FIG. 5, similar numerals as those of FIGS. 1 to 3 denote similar parts. In the structure of FIG. 5, the distance from the source to the drain becomes larger as the position approaches from the side of the terminal 102 to the side of the terminal 101. When the voltage $V_C$ of the voltage source 11 is zero, the current density is larger near the terminal 102 because of the shorter source-to-drain distance. As the position approaches the terminal 101, the current density becomes small. As the voltage $V_C$ is made larger with a negative sign, the current in the vicinity of the terminal 102 decreases while the current density in the vicinity of the terminal 101 does not decrease remarkably but the current density near the terminal 101 is small from the beginning. Thus, the rate of decrease in the total channel current is large and hence the controllability for the channel current by the controlling voltage $V_C$ is improved in this embodiment compared with the embodiment of FIG. 2 in which the source and the drain regions are parallel.

Here, it is naturally possible to form the gate region of the structure of FIG. 5 in a stripe shape as in the structure of FIG. 3.

Figure 6:
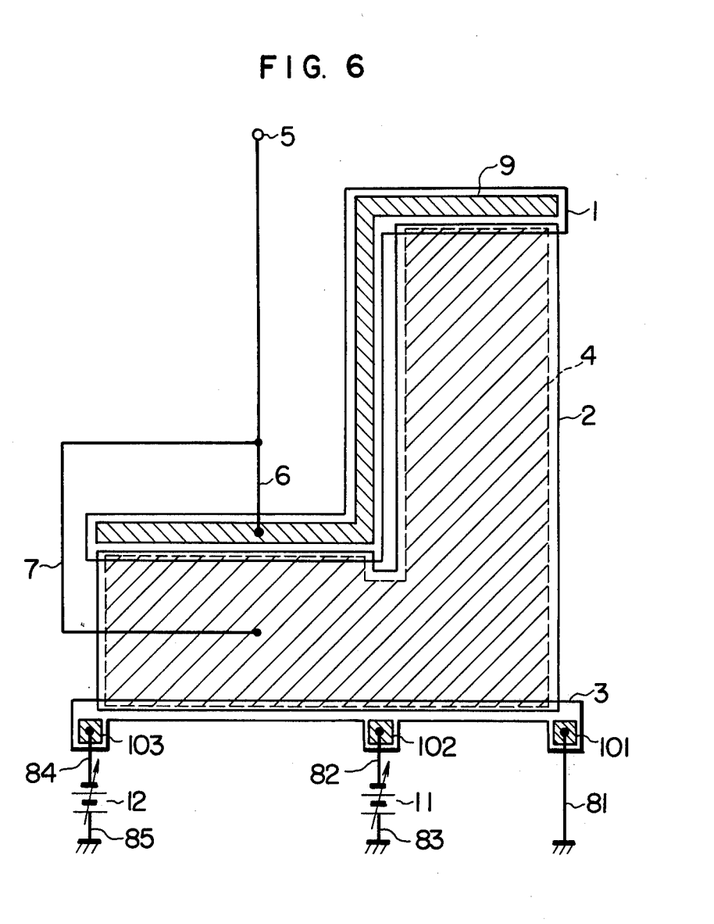
FIG. 6 is a schematic plan view of a variable impedance device according to still another embodiment of this invention.

Another embodiment of the variable impedance device is shown in FIG. 6, in which reference numerals similar to those of the proceding figures denote similar parts. In this embodiment, two regions having different source-to-drain distances are connected in parallel. In the region having a longer source-to-drain distance, a source electrode 101 formed on one end of the source region is grounded and another source electrode 102 formed on the other end of the region has a voltage $V_C$ applied thereto by a voltage source 11 connected between electrode 102 and ground. In the region having a shorter source-to-drain distance, the potential $V_C$ is applied at one end of the source region and at the other end another potential $V_{C2}$ is applied by another voltage source 12 through an electrode 103 and lead wires 84 and 85.

Now, the operation of this embodiment will be described. When the bias voltage $V_C$ is set at zero and the other bias voltage $V_{C2}$ is varied from zero to a certain negative value such as $-15$ volts with the drain electrode 5 having $-15$ volts applied thereto, the current density in the left half region having a shorter source-to-drain distance decreases because of the lowered field strength. Next, when the potential $V_C$ is varied gradually to a large negative value such as $-15$ volts keeping the other potential $V_{C2}$ fixed, the current in the lefthand half region having the shorter source-to-drain distance further decreases and finally becomes cut off while the current in the righthand half region having a longer source-to-drain distance decreases in a similar manner to that of the embodiment of FIG. 2.

In the above description, first the potential $V_{C2}$ is varied and then another potential $V_C$ is varied. It is also possible to apply the same voltage to the two electrodes 102 and 103, $V_{C2} = V_C$, and vary it simultaneously, or to vary the potentials $V_{C2}$ and $V_C$ in a certain relation held therebetween. Namely, various manners of bias voltage application can be adopted to obtain desired controllability.

As is apparent, according to the embodiment of FIG. 6, the controllability of a device can be arbitrarily selected by arbitrarily selecting the source-to-drain distances and the channel widths of the righthand and the lefthand portions and the manner of variation of the controlling voltages $V_{C2}$ and $V_C$. It will also be apparent that in this embodiment too, the gate areas may be formed in stripes as in the embodiment of FIG. 3 or in a trapezoid form to have a continuously varying source-to-drain distance as in the embodiment of FIG. 5, or further to adopt both of them.

Figure 7:
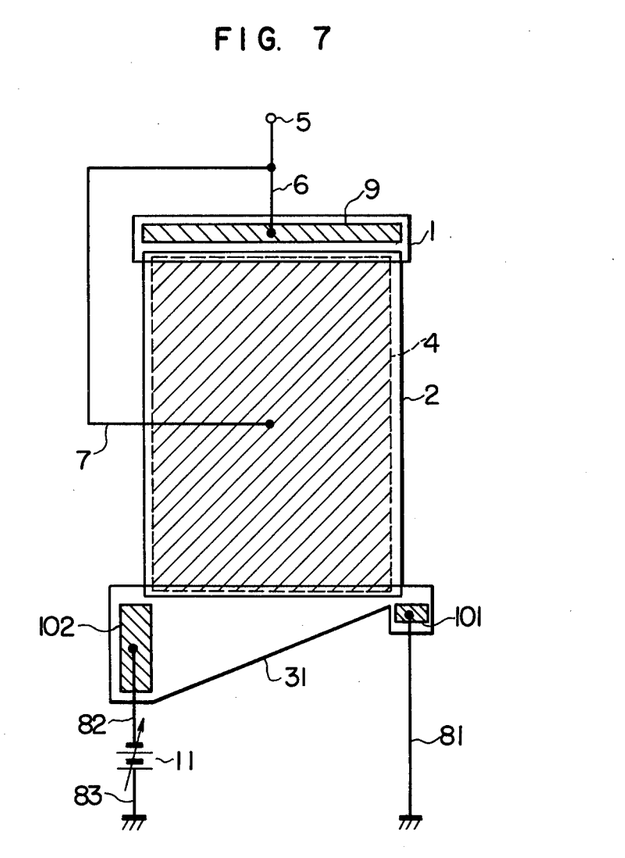
FIG. 7 is a schematic plan view of a variable impedance device according to a further embodiment of this invention.

Another embodiment is shown in FIG. 7, inwhich reference numerals similar to those of the preceding figures denote similar parts. In the embodiment of FIG. 7, a source region 31 formed of a resistive layer is arranged to have a smaller width in the vicinity of the terminal 101 and gradually increasing width as the position approaches the other terminal 102.

Figure 8:
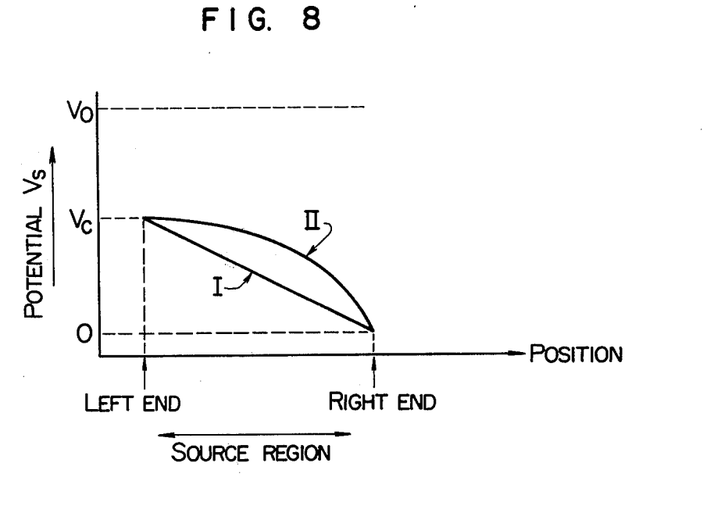
FIG. 8 is a diagram for illustrating the potential distribution in the source region of the device of FIG. 7.

In the structure of FIG. 2, the potential distribution in the source region changes almost linearly from $V_C$ to zero, whereas in the embodiment of FIG. 7 the resistance per unit length increases as the position shifts from the lefthand side to the righthand side of the source region 31 due to the decreasing cross-section; hence the potential distribution is no longer linear and the potential drop per unit length is larger at positions nearer to the terminal 101. Thus, in comparison to the case of FIG. 2, the source bias becomes deeper (more negative) in the intermediate region with the use of the same controlling voltage $V_C$. FIG. 8 shows the potential distribution in the source region for the cases of FIGS. 2 and 7. The ordinate represents the potential level and the abscissa the position in the source region. In the figure, line I represents the potential distribution in the source region of the structure of FIG. 2 and curve II that of the structure of FIG. 7. Since the source biasing potential becomes deeper in comparison to the case of FIG. 2, the decrease in the channel current becomes more apparent for the same controlling voltage $V_C$ as will also be apparent from equation (2). This means an improvement in the controllability for the channel current by the same controlling voltage $V_C$. Although the width of the source resistive layer is changed linearly in the embodiment of FIG. 7, the basic concept of this embodiment is to vary the width of the source region or the resistance per unit length so as to vary the potential distribution in the source region into a preferable shape. Thus, the change of the width of the source resistive layer is not limited to such a linear one but may be quadratic, stepwise, etc. so that the controllability for the channel current by the controlling voltage $V_C$ can be arranged to a desired type.

Figure 9:
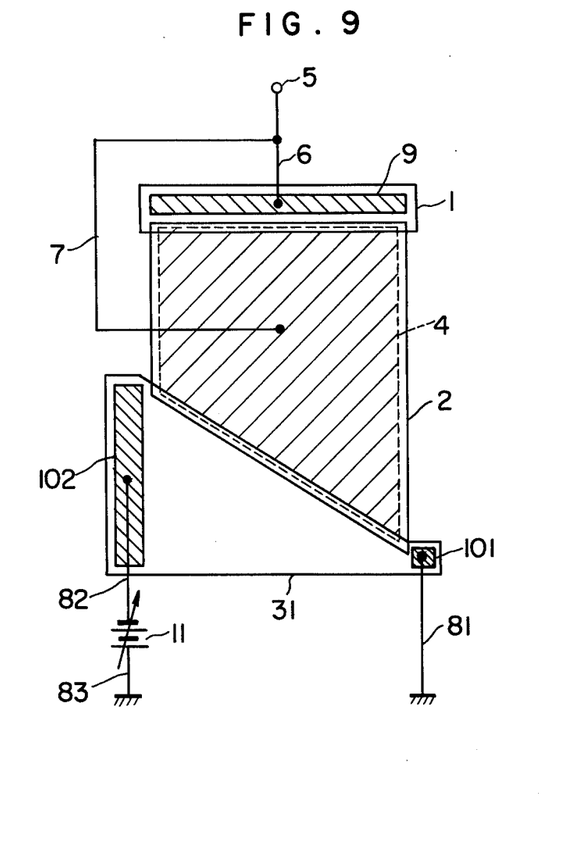
FIG. 9 is a schematic plan view of a variable impedance device according to yet another embodiment of this invention.

FIG. 9 shows another embodiment of the variable impedance element which has a source region with a similar structure to that of FIG. 7 and a base region with a similar structure to that of FIG. 5. From the lefthand side (terminal 102) to the righthand side (terminal 101), the source-to-drain distance becomes longer while the width of the source region becomes shorter. Namely, where the source-to-drain distance is short (long), the width of the source region is wide (narrow). Therefore, the structure of FIG. 9 has superior controllability by the controlling voltage $V_C$ to that of FIG. 5 similar to that the structure of FIG. 7 has superior controllability to that of FIG. 1. Further, according to the structure of FIG. 9, the shape of the semiconductor element is approximately rectangular. Thus, it is advantageous in that the loss space in a semiconductor chip is reduced, for example in integrating the circuit on a chip.

It will be apparent that also in the structures of FIG. 3 having a stripe-shape gate, and of FIG. 6 having a plurality of controlling electrodes, and the combinations of the structures of FIGS. 2, 3, 5 and 6, the width of the source resistive layer may be varied spatially to improve the controllability by the controlling voltage $V_C$ and thereby obtain desired controllability.

In a device having the structure of FIG. 5 but with a stripe-shaped gate as shown in FIG. 3, the channel current (with a drain voltage of $-15$ volts) was varied by a factor of about 30 by changing the controlling voltage $V_C$ from zero to $-15$ volts. When the source structure of this device was modified to have the structure of FIG. 9 with the maximum width approximately 5 times as large as the minimum width, the channel current could be varied by a factor of about 100 by a similar change of the controlling voltage.

In the above embodiments, the terminal 101 is connected to a standard potential through a lead wire 81. This standard potential may not coincide with the potential of the back gate (substrate) of the MOS transistor. When the standard potential differs from the potential of the substrate, it is only necessary to add the body effect to $V_T$ and there is no substantial difference from the foregoing embodiments.

Further, the gate electrodes in the above embodiments may be formed of such materials generally used in this field as metals such as aluminum, or silicon polycrystal.

In the foregoing embodiments, the gate electrode was always connected with the drain electrode, but apparently this invention is not limited to this type of connection. The gate potential may be varied in a certain relation with the drain potential or may be given independently. Such alternations are naturally within the scope of this invention.

Figure 10A:
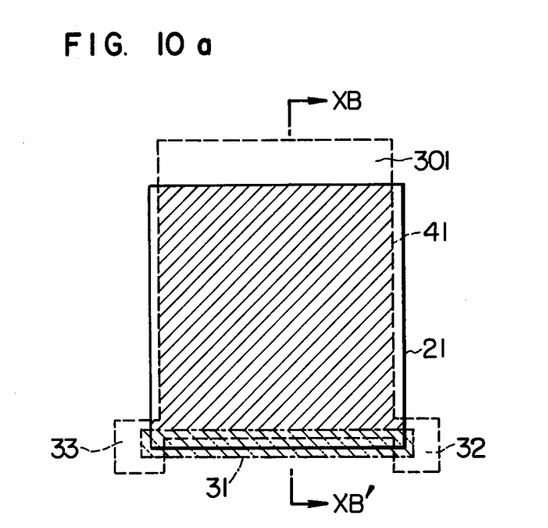
FIG. 10a, 10b and 10c are schematic plan and cross-sectional views of examples of concrete structures of a variable impedance device according to a still further embodiment of this invention.
Figure 10B:
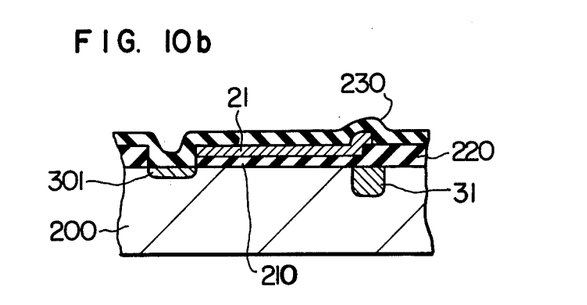

In the variable impedance MOS device, the drain region is preferably formed of a layer of sufficiently low resistance. On the other hand, when a controlling voltage is applied to an electrode on the source region, a current corresponding to the inverse of the resistance across the source region is allowed to flow through the source region. Thus, if the resistance of the source region is too low, there arises such problems as heat generation due to the loss current through the source region. The following structure and the manufacturing steps reduce such loss current to a sufficiently low value. An embodiment is shown in FIGS. 10a and 10b, in which FIG. 10b is a cross-section along the line XB – XB'. In the figures, numeral 21 denotes a layer of polycrystalline silicon. In the superposed area with a gate-cut area 41, the hatched area is the channel region. A drain region 301 and source contacts 32 and 33 are formed of p$^+$ - type diffused layer having a sheet resistivity of about 100 $\Omega\,\square$ formed in the region not provided with polycrystalline silicon by the gate-cut, by the use of the self-algnment method. A p-type layer 31 is formed prior to the formation of the gate-cut, and has a sheet resistivity of about 5 K$\Omega\,\square$. An n-type substrate 200 has a resistivity of 2 to 4 $\Omega$ cm. A gate oxide layer 210 has a thickness of about 1200 A, a field oxide layer 220 a thickness of about 6000 A, and a CVD (chemical vapor deposition) SiO$_2$ film 230 a thickness of about 4000 A.

Since the source region 31 is formed independently of the p$^+$ - type layer of the drain region 301 and the source contact regions 32 and 33, an arbitrarily resistance can be selected for the source region 31 to depress the loss current to the minimum value. Further in the case of integrating the present element in a chip together with other circuit components, the high frequency characteristics of the other components can be maintained high by forming the other components with silicon gate MOS transistors by the self-alignment method, forming the source and the drain of these transistors with a diffused layer having a sheet resistivity of for example about 200 $\Omega\,\square$, and forming only the source region of the variable impedance element with another diffused layer of high sheet resistivity.

Figure 10C:
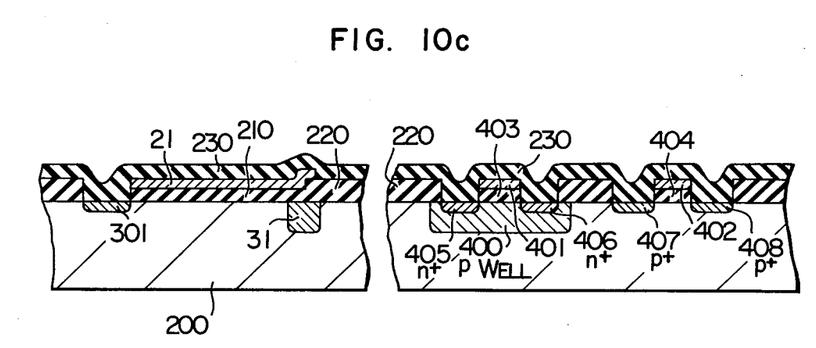

FIG. 10c shows a cross-sectional view of an example of a structure in which the present element is formed together with a complementary MOS circuit (referred to as C-MOS) in the same chip. In the structure, reference numerals 401 and 402 denote gate electrodes of an n-channel MOS transistor and or p-channel MOS transistor respectively, and 403 and 404 gate oxide layers respectively. Regions 405 and 406 respectively indicate the source and the drain of the n-channel MOS transistor formed in a p-well 400. Regions 407 and 408 are the source and the drain of the p-channel MOS transistor. The source region 31 can be formed simultaneously in the p-well manufacturing step of the n-channel MOS transistor, and hence, the present element can be integrated by the C-MOS IC manufacturing step.

The sheet resistivity of the p-type source region 31 is preferably in the range from of the same order with the effective sheet resistivity of the channel region to about one tenth thereof. Generally, the effective sheet resistivity of the channel is of the order of 25 K$\Omega/\square$ in a p-channel silicon MOS element with a biasing voltage of $-10$V applied to the gate. Therefore, the sheet resistivity of 2.5 to 25 K$\Omega/\square$ is preferable for a p-type source region 31. A p-well layer has a sheet resistivity of about 5 K$\Omega/\square$ and hence it is appropriate to form the source region 31 and a p-well simultaneously. Low doping diffusion methods are used for the manufacture of wells, such as the ion implantation method or doped oxide method.

Figure 11A:
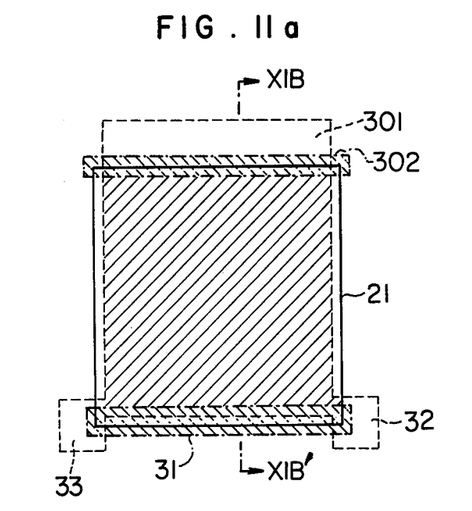
FIGS. 11a and 11b are a schematic plan and a cross-sectional views of an example of a concrete structure of a variable impedance device according to one more embodiment of this invention.
Figure 11B:
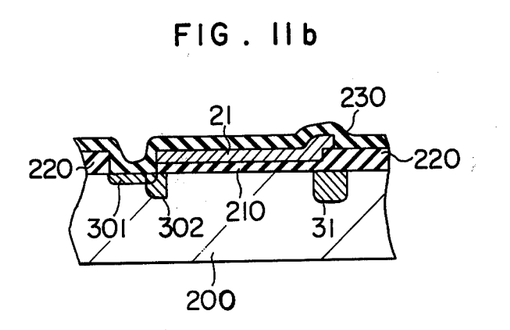

Another embodiment of the present structure is shown in FIGS. 11a and 11b, in which FIG. 11b is a cross-section along the line XIB – XIB' in FIG. 11a. In the figures, numerals similar to those of the preceding figures denote similar parts. In this embodiment, a p-type layer 302 is added to the structure of FIGS. 10a and 10b. The p-type layer 302 is formed by the same step for the p-type source region 31. In the structure of FIGS. 10a and 10b, the source-to-drain distance is the distance between the regions 301 and 31 which are patterned by different photomasks. Thus, the error in the registration of these photomasks results directly in the dispersion of the source-to-drain distance. In the structure of FIGS. 11a and 11b, however, the source-to-drain distance is the distance between the regions 302 and 31 which are patterned by the same photomask. Thus, there never arises such dispersion of the source-to-drain distance due to the error in the registration of photomasks. Furthermore, since the source and the drain electrodes are all connected to p$^+$ - type diffused regions, sufficiently good ohmic contacts can be formed by depositing aluminum, etc.

As is described above, loss current due to the application of a controlling voltage can be reduced sufficiently low by forming only the source resistive region with a region of high sheet resistivity. Further, this method of forming a source on a drain region with a layer of high sheet resistivity of this kind can be widely utilized in MOS type elements which utilize the potential drop or the potential distribution in the source or the drain region.

As has been described above, this invention provides a variable impedance element having downwardly convex current voltage characteristics which are also under influence of a controlling voltage applied to a controlling terminal or terminals.

Although the above embodiments have potential distribution in the source region of an MOS-FET, it is easy to form an MOS-FET which has a potential distribution in the drain region by forming the drain region of a resistive material and forming at least two electrodes on the drain region on at least one of which a controlling voltage is applied. When this element is used in the sustain circuit of an electronic musical instrument as a variable impedance element for discharging a capacitor, there are provided such advantages that 1. the envelope of a damping sound signal in the sustain operation mode damps very rapidly in the former half period of the damping, and then damps slowly in the latter half period of the damping, thereby providing a natural sound resembling damping characteristic, 2. the damping time constant can be easily altered by varying the controlling voltage applied to the controlling electrode of the present element, etc. The present element is a basic circuit element which can be applied in various ways. For example, the present element may be combined with a capacitor, etc. to perform the damping envelope control of time signal sounds in an electronic clock and to generate a few kinds of long and short time signal sounds. Thus, this invention has a large and wide utility.

What we claim is:

1. A metal-oxide-semiconductor (MOS) device comprising:
   a semiconductor substrate of one conductivity type;
   a source and a drain region of an opposite conductivity type selectively formed in said semiconductor substrate;
   a gate electrode disposed between said source and drain regions;
   a channel portion formed in the semiconductor substrate beneath said gate electrode;
   a plurality of source electrodes formed on said source region, said source electrodes being spaced from each other in a direction across the width of said channel portions; and
   a variable potential source for applying a variable control voltage to at least one of said source electrodes, the resistance of the source region between said plurality of source electrodes establishing a potential distribution and said control voltage applied to the source electrode controlling a channel current through the channel portion between said source and drain regions.

2. An MOS type semiconductor device according to claim 1, wherein the distance between said drain region and a first of said plurality of source electrodes is different from that between said drain region and a second of said source electrodes.

3. An MOS type semiconductor device according to claim 1, in which said effect transistor channel region is at least partially formed in a stripe shape so that the channel current flows along the stripes.

4. An MOS type semiconductor device according to claim 1, in which the source-to-drain distance near said at least one electrode to which a variable control voltage is applied is shorter than that near the other electrode.

5. An MOS type semiconductor device according to claim 4, in which the distance between said drain region and a line connecting the two source electrodes in the source region varies linearly with the distance from one of the electrodes.

6. An MOS type semiconductor device according to claim 1, in which the width of the source region is wider near said at least one electrode to which a variable control voltage is applied than near the other electrode.

7. An MOS device according to claim 1, in which the source region formed in said substrate comprises high impurity concentration regions on which said spaced source electrodes are disposed to make an ohmic contact therewith and low impurity concentration regions disposed between said spaced source electrodes exhibiting a high resistivity.

8. An MOS type semiconductor device according to claim 7, in which said region of high sheet resistivity is formed by the same step as that for forming a well in a complementary MOS integrated circuit integrated in the same chip.

9. An MOS device having a field effect transistor structure comprising:
   a semiconductor substrate of one conductivity type;
   a drain and a source region of an opposite conductivity type spaced from each other in said semiconductor substrate:
   a gate electrode disposed between said source and drain regions;
   a channel region formed in said substrate between said drain and source regions and beneath said gate electrode; and
   a first and a second electrode spaced from each other and formed on said source region in the vicinity of end portions thereof, said first and second electrodes being disposed along the width of said channel region and being connected to a reference potential terminal and a source of a variable control potential respectively, whereby a potential distribution is produced in a high resistive region of the source region between said first and second electrodes and a variable impedance is provided by controlling the channel current through said channel region with said control potential source.

10. An MOS type semiconductor device according to claim 9, in which said channel region is at least partially formed in stripe shape so that the channel current flows along said stripes.

11. An MOS type semiconductor device according to claim 9, in which the source-to-drain distance becomes shorter as the position shifts from near said first electrode to near said second electrode.

12. An MOS type semiconductor device according to claim 9, in which the width of said source region becomes wider as the position shifts from near said first electrode to near said second electrode.

13. An MOS device according to claim 9, in which said source region formed in said semiconductor substrate comprises high impurity concentration regions on which said first and second electrodes are disposed to make ohmic contact therewith and low impurity concentration regions having a high resistivity and disposed between said first and second electrodes.

14. An MOS type semiconductor device according to claim 13, in which said layer of high sheet resistivity is formed in the same steps as those for forming a well of a complementary MOS integrated circuit coexisting in the same semiconductor chip.

* * * * *